(12) United States Patent
Gallmeyer

(10) Patent No.: US 6,794,795 B2
(45) Date of Patent: Sep. 21, 2004

(54) METHOD AND APPARATUS FOR EXCITING A PIEZOELECTRIC MATERIAL

(75) Inventor: Christopher F. Gallmeyer, Peoria, IL (US)

(73) Assignee: Caterpillar Inc, Peoria, IL (US)

( * ) Notice: Subject to any disclaimer, the term of this patent is extended or adjusted under 35 U.S.C. 154(b) by 5 days.

(21) Appl. No.: 10/025,643

(22) Filed: Dec. 19, 2001

(65) Prior Publication Data

US 2003/0111933 A1 Jun. 19, 2003

(51) Int. Cl.$^7$ ............................................. H01L 41/08
(52) U.S. Cl. ...................... 310/315; 310/317; 310/328; 310/330
(58) Field of Search ................. 310/315, 316.01, 310/317, 319, 328, 330–332, 314, 316.03; 318/116–118

(56) References Cited

U.S. PATENT DOCUMENTS

| | | | |
|---|---|---|---|
| 4,267,478 A | * 5/1981 | Ljung et al. ................ 310/315 |
| 4,550,744 A | 11/1985 | Igashira et al. | |
| 4,560,263 A | * 12/1985 | Katsuma et al. ............. 396/133 |
| 4,570,098 A | 2/1986 | Tomita et al. | |
| 4,853,578 A | * 8/1989 | Takahashi et al. .......... 310/315 |
| 4,980,699 A | * 12/1990 | Tanabe et al. ................ 346/1.1 |
| 5,126,618 A | 6/1992 | Takahashi et al. | |
| 5,365,140 A | 11/1994 | Ohya et al. | |
| 5,387,834 A | * 2/1995 | Suzuki ........................ 310/317 |
| 5,585,686 A | * 12/1996 | Kataoka ...................... 310/341 |
| 5,589,725 A | * 12/1996 | Haertling ..................... 310/358 |
| 5,632,841 A | * 5/1997 | Hellbaum et al. .......... 156/245 |
| 5,796,206 A | 8/1998 | Asai et al. | |
| 5,861,702 A | * 1/1999 | Bishop et al. ............... 310/330 |
| 6,229,245 B1 | * 5/2001 | Kitani .................... 310/316.01 |
| 6,400,062 B1 | * 6/2002 | Gallmeyer et al. .......... 310/315 |

* cited by examiner

Primary Examiner—Mark Budd

(57) ABSTRACT

Apparatus and methods for exciting a piezoelectric device. A control device receives a first control signal excites the piezoelectric device at about at least one predetermined electrical resonant frequency of the piezoelectric device as a function of the first control signal.

26 Claims, 3 Drawing Sheets

METHOD AND APPARATUS FOR EXCITING A PIEZOELECTRIC MATERIAL

TECHNICAL FIELD

This invention relates generally to piezoelectric devices, and more particularly to heating piezoelectric devices through an excitation signal.

BACKGROUND

Piezoelectric devices, such as piezoelectric actuators, generally consist of a piezoelectric material that deforms when an electric field, e.g., a driving field, is applied across it. Additional materials may be bonded with the piezoelectric material, such as metallic layers that act as electrodes, insulating materials to prevent current from flowing between particular areas of the device, and adhesives to bond the various layers together.

In simplified terms, piezoelectric materials are comprised of many dipole unit cells. FIG. 1 symbolically depicts a unit cell 10 of a piezoelectric materia. When an electric field E1 is applied in the direction shown, the unit cell grows in the y axis and shrinks in the x axis, in essence becoming tall and thin. Conversely, when an electric field E2 is applied in the direction shown, the unit cell shrinks along the y axis and grows along the x axis, in essence, becoming short and fat.

As the unit cell 10 becomes colder, the piezoelectric effect, i.e., response to the application of an electric field, decreases. Thus, for a given magnitude of an electric field, the unit cell will not grow/shrink as much as it did when it was warmer. As a practical matter, for the same electric field applied, this decreases the stroke of the piezoelectric device. For example, for some piezoelectric materials, a 35% loss of stroke was found when the temperature changed from 25 degrees Celsius to −40 degrees Celsius.

SUMMARY OF THE INVENTION

The present invention provides apparatus and methods for exciting a piezoelectric device. A control device receives a first control signal excites the piezoelectric device at about at least one predetermined electrical resonant frequency of the piezoelectric device as a function of the first control signal.

DETAILED DESCRIPTION

Figure 1:
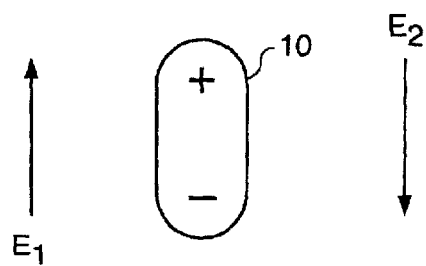
FIG. 1 symbolically depicts a unit cell 10 of a piezoelectric material.
Figure 2:
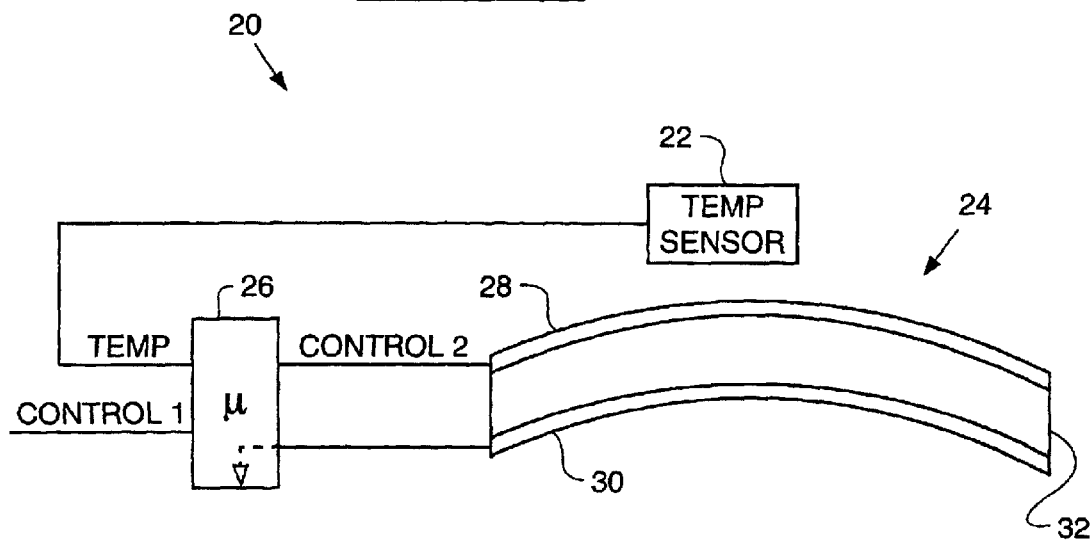
FIG. 2 shows an apparatus 20 for exciting a piezoelectric device according to one embodiment of the invention.

FIG. 2 shows an apparatus 20 for exciting a piezoelectric device according to one embodiment of the invention. The apparatus 20 may be used to heat the piezoelectric device. A temperature determining device, such as a temperature sensor 22 or other device described below, may determine or detect a temperature of the piezoelectric device, such as a piezoelectric sensor or piezoelectric actuator 24, or a temperature proximate to the piezoelectric device, and transmits a temperature signal ("TEMP") indicative of that temperature, i.e., a value indicative of the approximate temperature.

Figure 3:
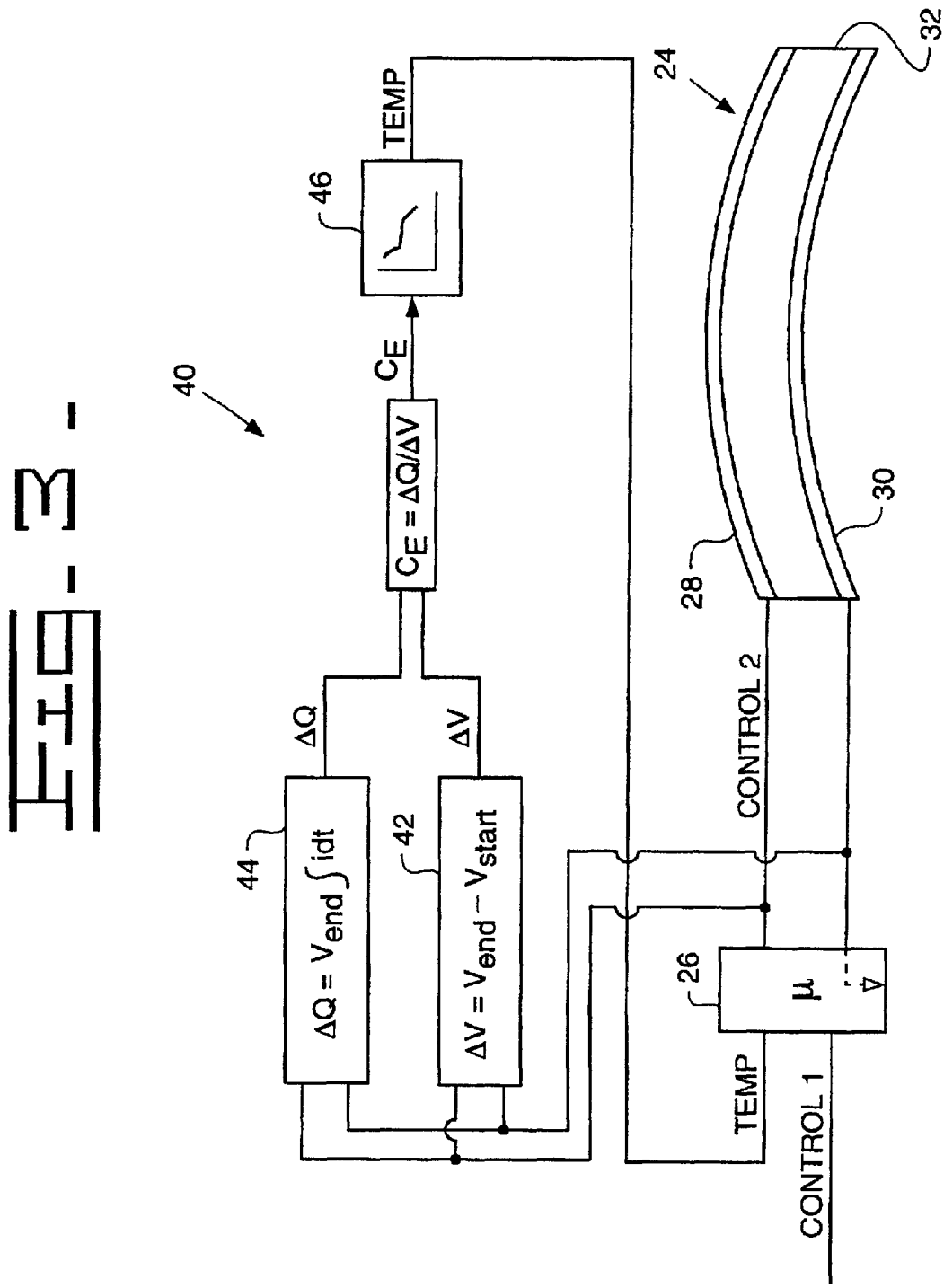
FIG. 3 shows a polarization estimating circuit according to one embodiment of the invention.

In embodiments of the invention, the temperature sensor 22 may be omitted. In some embodiments, the temperature signal TEMP may be determined from an estimated ferroelectric polarization of the piezoelectric device. More particularly, instead of the temperatures sensor 22, the temperature determining device may include a polarization estimating circuit 40 (FIG. 3) that is coupled with the piezoelectric actuator 24 by ways known to those skilled in the art, as will be evident from the discussion below.

For a predetermined duration of time, the polarization estimating circuit 40 determines the change in applied voltage $\Delta V$ to the piezoelectric actuator 24 by ways known to those skilled in the art, such as with a comparator circuit 42, for example. During that same general duration of time, the polarization estimating circuit determines the change in charge $\Delta Q$ on the piezoelectric actuator 24, such as by a current integrating circuit 44, for example, coupled with the piezoelectric actuator 24 by ways known to those skilled in the art.

From the values for the changes in voltage $\Delta V$ and charge $\Delta Q$, an equivalent capacitance CE of the actuator 24 may be determined generally by the following equation, where the equivalent capacitance CE is dependent on the physical construction of the actuator 24 and on the temperature proximate the operating environment of the actuator 24:

$$CE = \Delta Q / \Delta V$$

Typically, more accurate estimations of the equivalent capacitance CE are obtained with values for the change in voltage $\Delta V$ that are a significant portion (>50%) of the full voltage range of the piezoelectric actuator 24. Smaller percentages may also be used, although accuracy in the equivalent capacitance CE calculation may suffer. The voltage vs. charge hysteresis curve of the piezoelectric actuator 24 will typically determine the minimum value of $\Delta V$ that may be used in this calculation without a significant loss of accuracy.

The polarization estimating circuit 40 may include an empirical map or data structure 46 that is operable to receive the equivalent capacitance CE as an input to the data structure 46. The empirical map or data structure 46 is typically derived from the ferroelectric polarization hysteresis curves of the piezoelectric actuator 24 to generate the temperature signal TEMP.

The equivalent capacitance CE effectively gives a unique slope value on the ferroelectric polarization hysteresis curves that can be correlated to the estimated temperature proximate the piezoelectric actuator 24, as will be appreciated by those skilled in the art. The data structure 46 may be a look-up table stored in RAM or ROM, a software algorithm or a hardwired circuit that is operable to generate the temperature signal TEMP in response to the equivalent capacitance CE.

A control device, e.g., a controller, such as a microcontroller or microprocessor 26, may receive the temperature signal TEMP from the temperature determining device, e.g., temperature sensor 22, and also receive a first control signal ("CONTROL1") indicative of a desired excitation of the piezoelectric actuator 26. The first control signal CONTROL1 may be generated by any of a variety of ways known to those skilled in the art. Although the piezoelectric actuator 24 is depicted as a thermally pre-stressed bender actuator, a variety of other piezoelectric actuators could also be used, such as a variety of unimorph, bimorph, and/or stacks known to those skilled in the art.

The microprocessor 26 transmits a second control signal ("CONTROL2") to the piezoelectric device 24 as a function of at least one of the temperature signal TEMP and the first control signal CONTROL1. In one embodiment of the invention, the microprocessor 26 may transmit the second control signal CONTROL2 when the temperature signal TEMP indicates that the temperature of the piezoelectric actuator 24 is less than a predetermined temperature and/or when the first control signal CONTROL1 is received. The predetermined temperature may vary depending on the application of the piezoelectric actuator. Thus, in embodiments of the invention either one of the temperature signal TEMP and the first control signal CONTROL1 may be omitted.

The second control signal CONTROL2 creates an electric field across the piezoelectric actuator 24 by any of a variety of ways known to those skilled in the art. For example, the second control signal CONTROL2 could be a voltage or current/charge applied to a first electrode 28 of the piezoelectric actuator 24.

A second electrode 30 may be spaced some distance from the first electrode 28, with a piezoelectric material 32, such as PZT-5A, for example, disposed therebetween. The second electrode 30 is typically grounded, although in other embodiments it need not be, thereby creating an electrical field between the two electrodes 28, 30, and across the piezoelectric material 32. In other embodiments, a third control signal, such as the complement of the second control signal CONTROL2 or some other voltage, current and/or charge could be applied to the second electrode 30.

In one embodiment of the invention, the second control signal CONTROL2 may be at a frequency approximately equal to an electrical resonant frequency of the piezoelectric actuator 24. In another embodiment of the invention, the second control signal CONTROL2 may be at a frequency near an electrical resonant frequency, or within some predetermined range of an electrical resonant frequency. The predetermined range may depend upon the desired efficiency of heating of the piezoelectric actuator 24, as will be described below.

In one embodiment of the invention, the frequency of the second control signal CONTROL2 may be at a first series resonance of the piezoelectric material 32. In another embodiment of the invention, any of the other appropriate series resonant frequencies of the piezoelectric material 32 may be used. With many piezoelectric materials 32, however, with each higher series resonant frequency, greater power is required to generate the signal, typically due to a higher impedance of the piezoelectric material 32. This may be undesirable in some applications. Thus, for lower power usage, the first series resonant frequency may be used.

In one embodiment of the invention, the frequency of the second control signal CONTROL2 may be at a first parallel resonance of the piezoelectric material 32. In another embodiment of the invention, any of the other appropriate parallel resonance frequencies of the piezoelectric material 32 may be used. Like the series resonant frequencies, however, with each higher parallel resonant frequency, greater power may be required to generate the second control signal CONTROL2. Again, this may be undesirable in some applications.

By applying the second control signal CONTROL2 at a resonant frequency of the piezoelectric material 32, the piezoelectric material 32 is in effect, a purely (or nearly pure) resistive load. The reactant component of the piezoelectric material 32 is reduced, or minimized. This encourages power dissipation in the piezoelectric actuator 24 through heating of the piezoelectric material 32.

By applying the second control signal CONTROL2 at a frequency close to, or within some predetermined range of the resonant frequency of the piezoelectric material 32, the piezoelectric material 32 becomes less of a resistive load and more of a reactive load. For a given time period, the power dissipation through heating will typically be proportionally lower the more reactive the load is. Thus, less heating will be achieved for the same level of power provided to the piezoelectric actuator 24. This, however, may be acceptable depending on the particular application and power supply being used.

Figure 4:
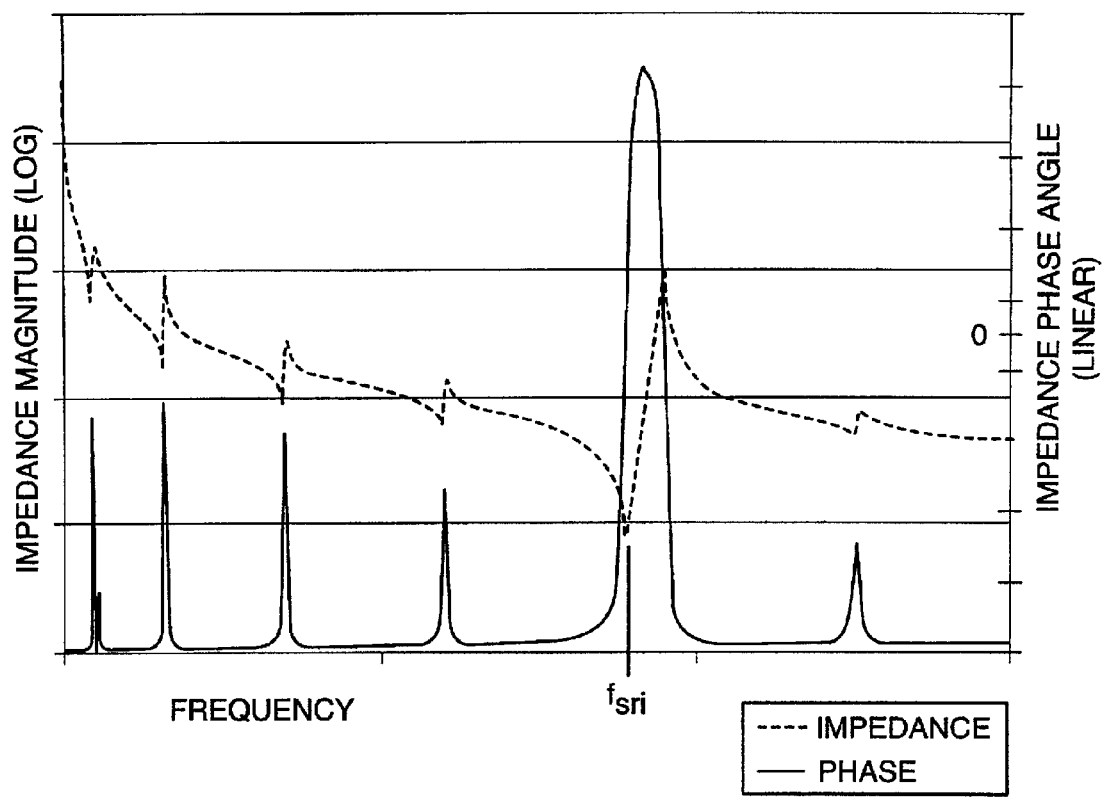
FIG. 4 is a graph of a typical piezoelectric material 32 impedance according to one embodiment of the invention.

FIG. 4 is a graph 50 of a typical piezoelectric material 32 impedance according to one embodiment of the invention. The reactive portion of the impedance will typically be minimized, e.g., zero, where the impedance phase angle is equal to zero. The first series resonant frequency ("fSR1") will typically be at a frequency where the impedance is minimized. For example, for PZT-5A piezoelectric material, the first series resonant frequency fSR1 will typically occur around 90–100 kHz.

In many instances, when exciting the piezoelectric material 32 at a resonant frequency, the piezoelectric actuator 24 will not move. The resonant frequency may be significantly higher than the normal operating frequency of the piezoelectric material. For example, the PZT-5A piezoelectric material is typically driven to cause displacement using approximately a 55 kHz signal, while the first series resonant frequency is around 90–100 kHz. At the first series resonant frequency, the input signal to the piezoelectric actuator 24 may be changing too rapidly for the piezoelectric actuator 24 to respond mechanically. Thus, the piezoelectric actuator does not displace when it is excited at this higher frequency. This may prolong the life of the piezoelectric actuator 24 as compared to other heating techniques that cause movement by the actuator 24.

The particular waveform of the second control signal CONTROL2 may be arbitrary, e.g., a sine wave, a square wave, a triangle wave, etc. Generally, better heating of the piezoelectric actuator 24 may be achieved by using a waveform having significant signal power at the resonant frequency.

The apparatus 20 for exciting the piezoelectric actuator 24 may be separate from, or integrated into (as shown) the normal control device/circuitry for the piezoelectric actuator 24. When integrated, typically the first control signal CONTROL1 will have a first characteristic when excitation of the piezoelectric actuator 24 at an electrical non-resonant frequency is desired (e.g., when movement is desired), and will have a second characteristic when excitation at an electrical resonant frequency is desired (e.g., when heating is desired). This may be accomplished by a variety of ways known to those skilled in the art, such as by way of example, applying a first magnitude of voltage as the first control signal CONTROL1 when an electrical non-resonant frequency is desired and applying a second magnitude of voltage when an electrical resonant frequency is desired.

INDUSTRIAL APPLICABILITY

In operation, in embodiments of the invention using both the temperature signal TEMP and the first control signal CONTROL1, the first control signal is typically transmitted to the microprocessor 26 when heating of the piezoelectric actuator 24 is desired. This may occur during a pre-operational, initialization, or warm-up period by any of a variety of ways known to those skilled in the art.

If the temperature signal TEMP indicates that the temperature of the piezoelectric device 24 is below the predetermined temperature, the second control signal CONTROL2 may be transmitted to the piezoelectric actuator 24.

The second control signal CONTROL2 may be at one or more of the electrical resonant frequencies of the piezoelectric material 32 in the piezoelectric actuator 24. Thus, the piezoelectric actuator 24 will generate heat, but little or no movement. The second control signal CONTROL2 may then continue until the piezoelectric actuator reaches a second predetermined temperature, or until some other event occurs, such as the passage of a predetermined time period.

Thus, the apparatus 20 may be used to warm a piezoelectric actuator 24 that is at a cold temperature to avoid the loss of performance due to (cold) temperature effects.

In embodiments of the invention where the temperature signal TEMP is omitted, the microprocessor 26 may transmit the second control signal CONTROL2 whenever the first control signal CONTROL1 is received.

In embodiments of the invention where the first control signal CONTROL1 is omitted, the microprocessor 26 may transmit the second control signal CONTROL2 whenever the temperature of the piezoelectric actuator 24 is below or above the predetermined temperature. This situation will typically occur when separate control circuitry (not shown) is used to control the displacement of the piezoelectric actuator 24. The separate control circuitry may be prevented/preempted from trying to move the piezoelectric actuator 24 while the apparatus 20 is exciting the piezoelectric actuator 24 at an electrical resonant frequency, e.g., during the heating period.

The apparatus 20 may be used to heat up a piezoelectric actuator 24. By appropriate selection of the frequency of the signal used to excite the piezoelectric actuator, mechanical movement by the actuator 24 may be minimized or eliminated. By heating the piezoelectric actuator 24 in this way, the effective operating temperature range of the piezoelectric actuator 24 may be increased. Further, when the piezoelectric actuator 24 is in a cold environment, the stroke of the piezoelectric actuator 24 may not be reduced because the actuator 24 is at a warmer temperature.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus for affecting a temperature of a piezoelectric device, comprising:
    a control device operable to receive a first control signal and to excite the piezoelectric device at about at least one predetermined electrical resonant frequency of the piezoelectric device as a function of the first control signal,
    wherein said electrical resonant frequency is significantly higher than a normal operating frequency such that the temperature of the piezoelectric device increases while substantially minimal mechanical movement of the piezoelectric device occurs relative to a displacement associated with said normal operating frequency.

2. The apparatus of claim 1 wherein the first signal comprises an excitation signal indicative of a desired excitation of the piezoelectric device.

3. The apparatus of claim 2 wherein the control device is further operable to receive a temperature signal indicative of the temperature of the piezoelectric device, and the control device is further operable to excite the piezoelectric device at the about at least one predetermined electrical resonant frequency as a function of the temperature signal.

4. The apparatus of claim 3 wherein the control device is operable to excite the piezoelectric device at the about at least one predetermined electrical resonant frequency as a function of the temperature signal indicating a temperature less than a predetermined value.

5. The apparatus of claim 1 wherein the first signal comprises a temperature signal indicative of the temperature of the piezoelectric device.

6. The apparatus of claim 5 wherein the control device is operable to excite the piezoelectric device at the about at least one predetermined electrical resonant frequency as a function of the temperature signal indicating a temperature less than a predetermined value.

7. The apparatus of claim 5 wherein the control device is further operable to receive an excitation signal indicative of a desired excitation of the piezoelectric device, and the control device is further operable to excite the piezoelectric device at the about at least one predetermined electrical resonant frequency as a function of the excitation signal.

8. The apparatus of claim 1 where the piezoelectric device comprises a piezoelectric actuator.

9. The apparatus of claim 1 wherein the piezoelectric actuator comprises a thermally pre-stressed bender actuator.

10. The apparatus of claim 1 wherein the at least one electrical resonant frequency comprises about at least one of the series resonant frequencies of the piezoelectric device.

11. The apparatus of claim 1 where the at least one electrical resonant frequency comprises about the first series resonant frequency of the piezoelectric device.

12. The apparatus of claim 1 wherein the at least one electrical resonant frequency comprises about at least one of the parallel resonant frequencies of the piezoelectric device.

13. The apparatus of claim 1 wherein the control device comprises at least one of a microcontroller and a microprocessor.

14. A method for affecting a temperature of a piezoelectric device, comprising:
    determining a first condition; and
    exciting the piezoelectric device at about at least one predetermined electrical resonant frequency of the piezoelectric device as a function of the first condition,
    wherein said electrical resonant frequency is significantly higher than a normal operating frequency such that the temperature of the piezoelectric device increases while substantially minimal mechanical movement of the piezoelectric device occurs relative to a displacement associated with said normal operating frequency.

15. The method of claim 14 wherein the first condition comprises a temperature indicative of the temperature of the piezoelectric device.

16. The method of claim 14 wherein exciting the piezoelectric device as a function of the first condition comprises exciting the piezoelectric device when the temperature indicative of the temperature of the piezoelectric device is less than a predetermined value.

17. The method of claim 14 wherein the first condition comprises a value indicative of a desired excitation of the piezoelectric device.

18. The method of claim 14 wherein exciting the piezoelectric device as a function of the first condition comprises exciting the piezoelectric device when the value indicative of the desired future operation is greater than a predetermined value.

19. A method for affecting a temperature of a piezoelectric device, comprising:
    receiving at least one of a first excitation signal indicative of a desired excitation of the piezoelectric device and a temperature signal indicative of the temperature of the piezoelectric device; and exciting the piezoelectric device at about at least one predetermined electrical resonant frequency of the piezoelectric device as a function of at least one of the first excitation signal and the temperature signal, wherein said electrical resonant frequency is significantly higher than a normal operating frequency such that the temperature of the piezoelectric device increases while substantially minimal mechanical movement of the piezoelectric device occurs relative to a displacement associated with said normal operating frequency.

20. The method of claim 19 wherein exciting the piezoelectric device at the about at least one predetermined electrical resonant frequency as a function of the temperature signal comprises exciting the piezoelectric device at the about at least one predetermined electrical resonant frequency as a function of the temperature signal indicating a temperature less than a predetermined value.

21. The method of claim 19 wherein the piezoelectric device comprises a piezoelectric actuator.

22. The method of claim 19 wherein the piezoelectric actuator comprises a thermally pre-stressed bender actuator.

23. The method of claim 19 wherein the at least one electrical resonant frequency comprises about at least one of the series resonant frequencies of the piezoelectric device.

24. The method of claim 19 wherein the at least one electrical resonant frequency comprises about the first series resonant frequency of the piezoelectric device.

25. The method of claim 19 wherein the at least one electrical resonant frequency comprises about at least one of the parallel resonant frequencies of the piezoelectric device.

26. A method for affecting a temperature of a piezoelectric device, comprising:

receiving an excitation signal indicative of a desired excitation of the piezoelectric device;

determining a first value indicative of the temperature of the piezoelectric device; and exciting the piezoelectric device at about at least one predetermined electrical resonant frequency of the piezoelectric device as a function of the excitation signal and the first value, wherein said electrical resonant frequency is significantly higher than a normal operating frequency such that the temperature of the piezoelectric device increases while substantially minimal mechanical movement of the piezoelectric device occurs relative to a displacement associated with said normal operating frequency.

* * * * *